United States Patent [19]
Lin

[11] Patent Number: 6,004,702
[45] Date of Patent: Dec. 21, 1999

[54] PHASE-SHIFTING MASK STRUCTURE AND METHOD OF FABRICATING THE SAME

[75] Inventor: Benjamin Szu-Min Lin, Chiayi, Taiwan

[73] Assignee: United Microelectronics Corp., Hsinchu, Taiwan

[21] Appl. No.: 09/083,211

[22] Filed: May 21, 1998

[30] Foreign Application Priority Data

Nov. 28, 1997 [TW] Taiwan ................................. 86117921

[51] Int. Cl.⁶ .................................................. G03F 9/00
[52] U.S. Cl. ............................................................ 430/5
[58] Field of Search ............................. 430/5, 322, 323; 378/35

[56] References Cited

U.S. PATENT DOCUMENTS 5,535,516  7/1996  Hashimoto et al. ......................... 430/5
5,604,060  2/1997  Miyashita et al. .......................... 430/5
5,674,647  10/1997  Isao et al. .................................... 430/5

*Primary Examiner*—S. Rosasco
*Attorney, Agent, or Firm*—Hickman Stephens & Coleman, LLP

[57] ABSTRACT

A phase-shifting mask (PSM) structure and a method for fabricating the same are provided. The PSM structure includes a quartz substrate and a shifter layer formed over said quartz substrate, each shifter layer being formed with a first thickness of specific value to serve as the blinding portion of the PSM and a second thickness of specific value to serve as the phase-shifting portion of the PSM. The shifter layer of two different thicknesses can be used to replace the conventional chromium layer to provide the desired blinding and phase shifting effects of the PSM.

14 Claims, 4 Drawing Sheets

|      | 157nm |      | 193nm |      | 248nm |      |
|------|-------|------|-------|------|-------|------|
|      | n     | k    | n     | k    | n     | k    |
| Al   | 0.08  | 1.68 | 0.10  | 1.81 | 0.17  | 2.70 |
| Ba   | 0.63  | 0.20 | 0.53  | 0.54 | 0.61  | 0.87 |
| Cd   | 0.46  | 0.69 | 0.40  | 1.00 | 0.40  | 1.52 |
| Cr   | 0.90  | 0.54 | 2.23  | 1.17 |       |      |
| Cu   | 1.00  | 1.03 | 0.90  | 1.40 |       |      |
| Au   | 1.47  | 1.11 | 1.43  | 1.15 | 1.41  | 1.35 |
| Mg   | 0.19  | 1.10 | 0.21  | 1.40 |       |      |
| Si   | 0.67  | 1.85 | 0.78  | 2.40 | 1.70  | 3.38 |
| Ag   | 0.95  | 0.76 | 1.05  | 1.14 | 1.39  | 1.34 |
| Rh   | 0.71  | 1.07 | 0.67  | 1.60 | 0.79  | 2.34 |
| Ni   | 1.01  | 1.17 | 1.01  | 1.46 | 1.40  | 2.10 |
| Ge   | 0.92  | 1.40 | 1.10  | 2.10 | 1.39  | 3.20 |
| Gap  | 0.90  | 1.50 | 1.20  | 1.84 | 2.37  | 4.19 |
| Sb   | 0.65  | 1.30 | 0.63  | 1.30 | 0.60  | 1.20 |
| InSb | 0.90  | 1.35 | 1.10  | 1.75 |       |      |
| PbS  | 0.96  | 1.20 | 0.95  | 1.49 |       |      |
| PbTe | 0.75  | 0.85 | 0.90  | 0.94 | 0.72  | 1.00 |
| PbSe | 0.71  | 0.62 | 0.65  | 0.80 | 0.54  | 1.20 |
| Cubic Carbon | (3.26 | 0.68) | 2.94 | 0.01 | 2.65 | 0.00 |
| SiO$_2$ | 1.69 | 0.00 | 1.56 | 0.00 | 1.51 | 0.00 |
| LiF  | 1.49  | 0.00 | 1.44  | 0.00 | 1.42  | 0.00 | n: Refractive Index    k: Attenuation Factor

PHASE-SHIFTING MASK STRUCTURE AND METHOD OF FABRICATING THE SAME

CROSS-REFERENCE TO RELATED APPLICATION

This application claims the priority benefit of Taiwan application serial no. 86117921, filed Nov. 28, 1997, the full disclosure of which is incorporated herein by reference.

BACKGROUND OF THE INVENTION

1. Field of the Invention

This invention relates to semiconductor fabrication technologies, and more particularly, to the structure of a phase-shifting mask (PSM) and a method for fabricating the same for use in the photolithography in semiconductor fabrication processes. The invention is characterized by the provision of only a single shifter layer that is formed with various thicknesses to provide the desired blinding and phase shifting effects.

2. Description of Related Art

In semiconductor fabrication, photolithography is an important and indispensable technique which is used to transfer circuit layout patterns through a mask onto pre-defined locations on a semiconductor wafer. Many processes in semiconductor fabrications, such as etching and ion implantation, require the use of photolithography. In a photolithographic process, resolution and depth of focus (DOF) are two major checkpoints used to appraise the quality of the pattern definition. A high level of integration requires a high resolution of pattern definition since the feature size is very small. To increase the resolution, a laser source with a very short wavelength, such as a krypton (Kr) deep ultraviolet laser with a wavelength of 2,480 Å (angstrom), is used as the exposure light in the photolithographic process. The use of a short-wavelength exposure light, however, will result in a shallow DOF. To allow high resolution and good DOF, one solution is to use the so-called phase-shifting mask (PSM).

Fundamentally, a PSM is formed by adding phase shifter layers on a conventional mask that can cause destructive interference to the light passing through it such that the contrast and resolution of the resulting pattern definition can be increased. One benefit of the PSM is that it can increase the resolution of pattern definition without having to change the wavelength of the exposure light.

FIGS. 1A–1C are schematic, cross-sectional diagrams used to depict three different conventional PSM structures. FIG. 1A shows a typical PSM, which includes a quartz substrate 10, a plurality of chromium (Cr) layers 12 coated over the quartz substrate 10 to serve as the blinding portions of the PSM and a shifter layer 14 that can cause a phase shift to the light passing through it so as to enhance the resolution of the resulting pattern definition from the PSM. FIG. 1B shows a conventional rim PSM, which includes a quartz substrate 10 and a plurality of Cr layers 12 coated over the quartz substrate 10. Each Cr layer 12 is covered by a shifter layer 16 that can cause a phase shift to the light passing through it so as to enhance the resolution of the resulting pattern definition from the PSM. FIG. 1C shows a variation of the rim PSM, which differs from the rim PSM of FIG. 1B only in that here the shifter layers 16 are layered beneath the Cr layers 12.

In the foregoing PSM structures respectively shown in FIGS. 1A–1C, the shifter layer is formed from $MoSi_zO_xN_y$ or $SiO_xN_y$. One drawback to these conventional PSM structures is that they all require two deposition steps (one for forming the Cr layers and the other for forming the shifter layers) and two etching steps (one for defining the Cr layers and the other for defining the shifter layers). The overall fabrication process is therefore quite complex in procedural steps, which makes the manufacturing cost considerably high.

SUMMARY OF THE INVENTION

It is therefore an objective of the present invention to provide a new PSM structure and a method for fabricating the same, in which a single shifter layer is used to replace the combination of a Cr layer and a shifter layer, the single shifter layer being formed with various thicknesses to provide both the desired blinding and phase shifting effects, such that the fabrication process is simplified in procedural complexity.

In accordance with the foregoing and other objectives of the present invention, a new PSM structure and a method for fabricating the same are provided.

The PSM structure of the invention includes a quartz substrate and a shifter layer formed over said quartz substrate Each shifter layer is formed with a first thickness of specific value to serve as the blinding portion of the PSM and a second thickness of specific value to serve as the phase-shifting portion of the PSM. The two thicknesses of the shifter layer respectively provide the desired blinding and phase shifting effects of the PSM.

The method of the invention for fabricating a PSM includes the following process steps of:

(1) preparing a quartz substrate;

(2) forming a shifter layer over said quartz substrate to a first thickness of specific value that allows the shifter layer to have a first transmittance and be able to cause a first phase shift to the light passing through it;

(3) removing selected portions of the shifter layer that are to be used as the unmasked portions of the PSM, in which a first part of the remaining portions of the shifter layer is defined as the blinding portions of the PSM and a second part of the same is defined as the phase-shifting portions of the PSM; and (4) reducing the phase-shifting portions of the PSM to a second thickness of specific value that allows the phase-shifting portions to have a second transmittance and be able to cause a second phase shift to the light passing through them.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
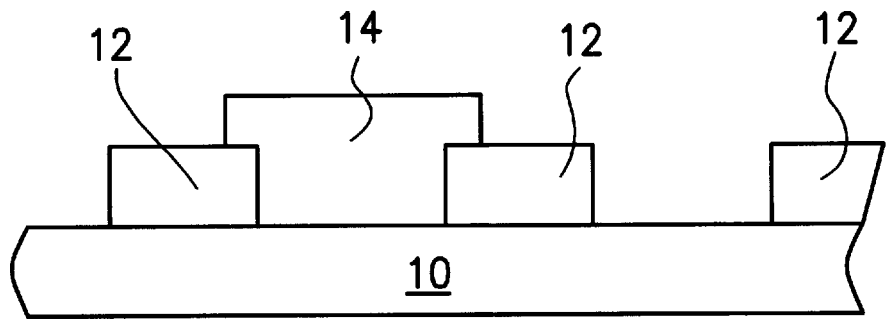
FIGS. 1A–1C are schematic cross-sectional diagrams used to depict three different conventional PSM structures.
Figure 1B:
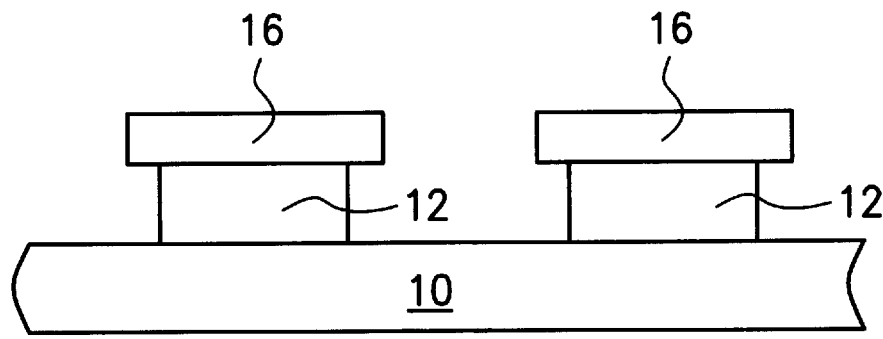
Figure 1C:
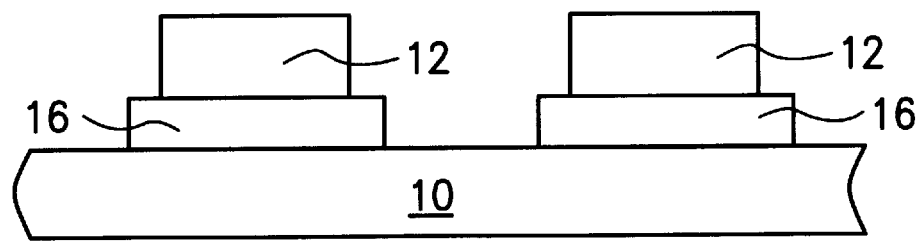
Figure 2:
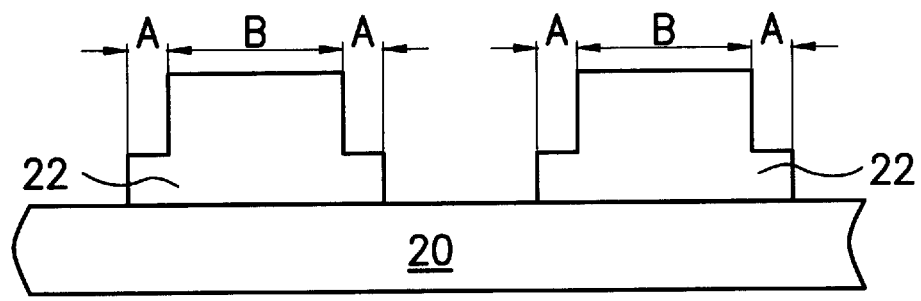
FIG. 2 is a schematic cross-sectional diagram showing the PSM structure according to the invention.

FIG. 2 is a schematic cross-sectional diagram showing the PSM structure according to the invention. As shown, the PSM structure of the invention includes a quartz substrate 20, which is transparent and allows the exposure light to pass through it entirely, and a plurality of shifter layers 22 formed over the quartz substrate 20. Each of the shifter layers 22 is formed with a thin portion A and a thick portion B. The thick portion B, due to its large thickness, has a large attenuation ratio to the light passing through it so it is used as the blinding portion of the PSM. The thin portion A, due to its lesser thickness, has a smaller attenuation ratio to the light passing through it, so it is used as the phase-shifting portion of the PSM.

Figure 3:
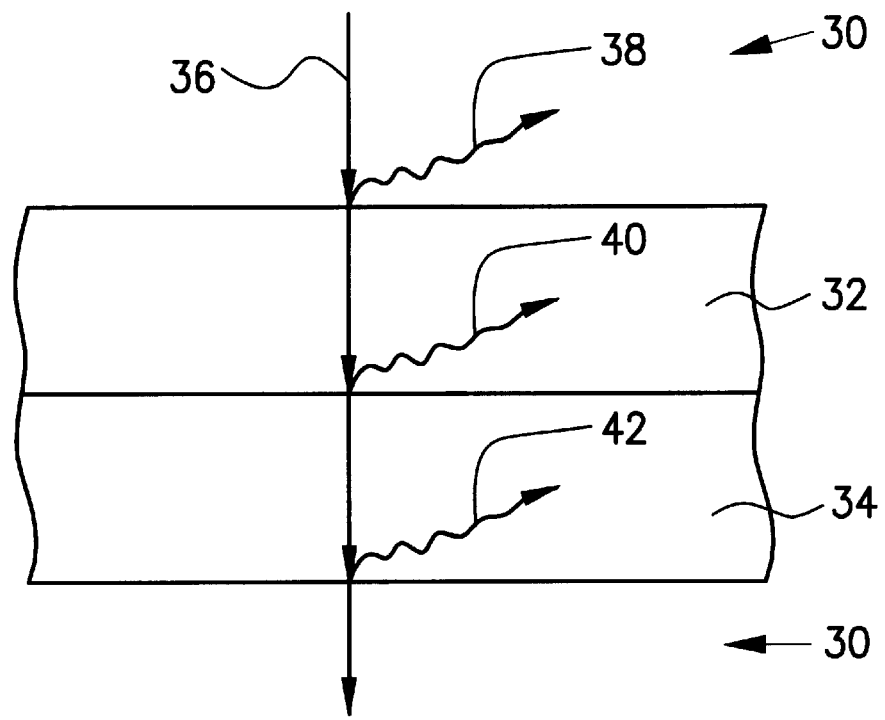
FIG. 3 is a schematic diagram used to depict the phenomenon of an exposure light beam passing through the shifter layer in the PSM structure of the invention.

The principle of the invention is described in the following with reference to FIGS. 3–4. FIG. 3 is a schematic diagram used to depict the phenomenon of an exposure light beam passing through the shifter layer in the PSM structure of the invention. In FIG. 3, the quartz substrate here is designated instead by the reference numeral 32, the shifter layer is designated instead by the reference numeral 34, the reference numeral 30 designates the ambient air medium and the reference numeral 36 designates an exposure light beam. During the photolithographic process, the exposure light will pass successively through the following mediums: the air medium 30 on the incident side→the quartz substrate 32→the shifter layer 34→the air medium 30 on the emerging side. According to optics, reflection and refraction will occur at each interface between two mediums of different refractive indexes. Assume the attenuation coefficient $k_0$ of the exposure light in air is $k_0=0$. When the exposure light 36 reaches the interface between the air medium 30 and the quartz substrate 32, part of the exposure light 36 will be reflected, as designated by the reference numeral 38 in FIG. 3. Assuming the quartz substrate 32 has a reflectivity $R_0$, an attenuation coefficient $k_1=0$ and a transmittance $T_1$, then $$T_1 = 1 - R_0$$

When the transmitted light reaches the interface between the quartz substrate 32 and the shifter layer 34, part of the light is reflected, as designated by the reference numeral 40. Assuming the shifter layer 34 has a reflectivity $R_1$, an attenuation coefficient $k_2$ and a transmittance $T_2$, then $$T_2 = (1-R_1) \times T_1 \times e^{-\alpha 1 x 1}$$

and $\alpha =$ $$\frac{4\pi k2}{\lambda}$$

where $\lambda$ is the wavelength of the exposure light in the shifter layer 34 and $x_1$ is the thickness of the shifter layer 34.

When the transmitted light reaches the interface between the shifter layer 34 and the outside air medium 30, part of the light will be reflected, as designated by the reference numeral 42. Assuming the reflectivity at this interface is $R_2$, the attenuation coefficient of the air medium 30 is 0 and the transmittance of the light at this interface is $T_3$, then $$T_3 = (1-R_2) \times T_2 = (1-R_2) \times (1-R_1) \times (1-R_0) \times e^{-\alpha 1 x 1} \quad (1)$$

From Eq. (1), it can be learned that since $R_0$, $R_1$, $R_2$ are fixed values that are dependent only on the particular material for forming the shifter layer 34, the transmittance $T_3$ is only related to the thickness of the shifter layer 34. Accordingly, the shifter layer can be varied in its transmittance by changing its thickness. Further, since the transmittance-to-thickness relationship is logarithmic, a relatively low transmittance can be obtained without having to form a very thick shifter layer.

Figure 4:
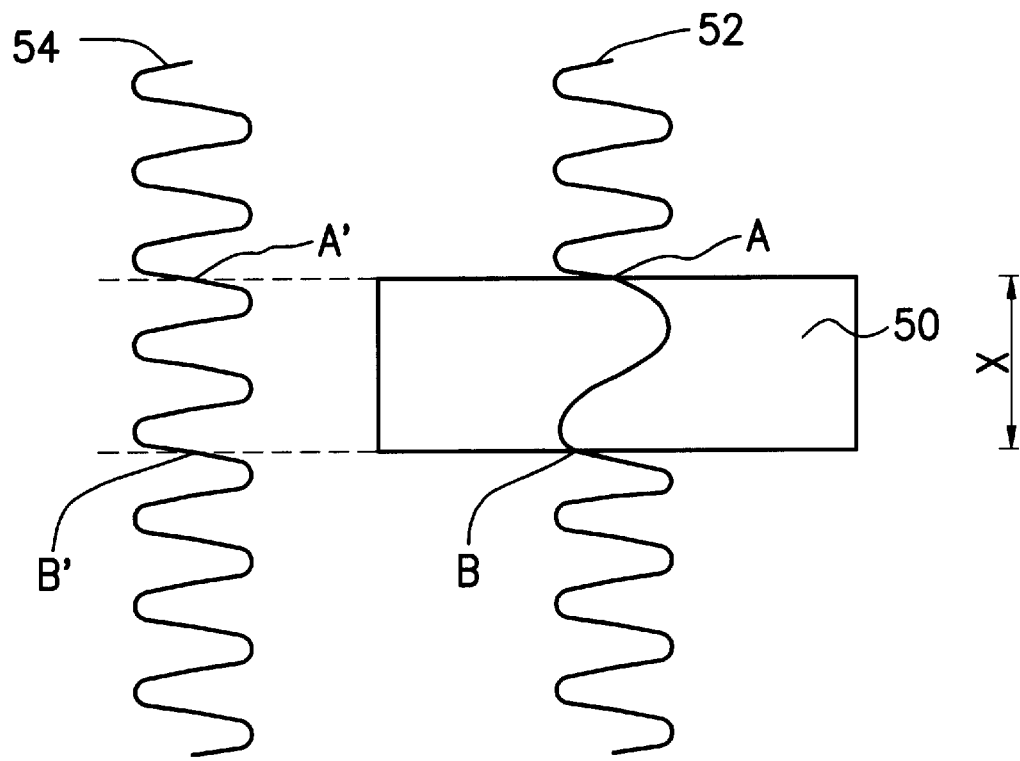
FIG. 4 is a schematic diagram used to depict how the shifter layer can cause the desired phase shift that can improve the quality of the pattern definition.

FIG. 4 is a schematic diagram used to depict how the shifter layer can cause the desired phase shift to the light passing through it so as to improve the quality of the resulting pattern definition from the PSM. Assume the shifter layer (here designated instead by the reference numeral 50) has a refractive index n and a thickness X. Further, assume that the exposure light has a wavelength $\lambda$ in air medium; therefore, the exposure light has a wavelength of $\lambda/n$ when traveling in the shifter layer 50. From basic optics, it can be deduced that the phase shift $\theta$ caused by the shifter layer 50 to the light passing through it is as follows:

$$\theta = \frac{X}{\lambda} - \frac{X}{\lambda/n} \quad (2)$$

In FIG. 4, assume the reference numeral 52 designates a first beam from the exposure light that passes through the shifter layer 50 and the reference numeral 54 designates a second beam from the exposure light that bypasses the shifter layer 50. As shown, at point A (the incident interface into the shifter layer 50) the beam 52 is identical in phase as the beam 54 at point A'. Due to the phase-shifting effect from the shifter layer 50, the beam 52 at the point B (the emerging interface from the shifter layer 50) is shifted in phase when compared to the beam 54 at point B'. In the case of FIG. 4, for example, the beam 52 lags in phase behind the beam 54 by 270°.

In accordance with the invention, it is desirable to make the phase difference between the beam 52 at the point B and the beam 54 at the point B' be exactly 180°, i.e., $$\theta = 2\pi \cdot m + \pi \quad m=0, 1, 2, 3, \quad (3)$$

From Eqs. (2) and (3), it can be learned that the desired phase shift of 180° can be obtained simply by choosing a material with a suitable refractive index n for the shifter layer 50 and then prescribing a suitable thickness X to the shifter layer 50.

In conclusion, in a PSM, both the blinding and phase shifting effects can be obtained from a single layer of a particular optical material that is formed with two different thicknesses. In the case of FIG. 2, for example, the area B of each shifter layer 22 is formed with a large thickness that allows the area B to have a low transmittance ratio so as to provide the desired blinding effect of the PSM, while the area A is formed with a specific thickness that precisely allows the area A to cause a phase shift of 180° to the light passing through it so as to provide the desired phase-shifting effect.

Figures 5, 6:
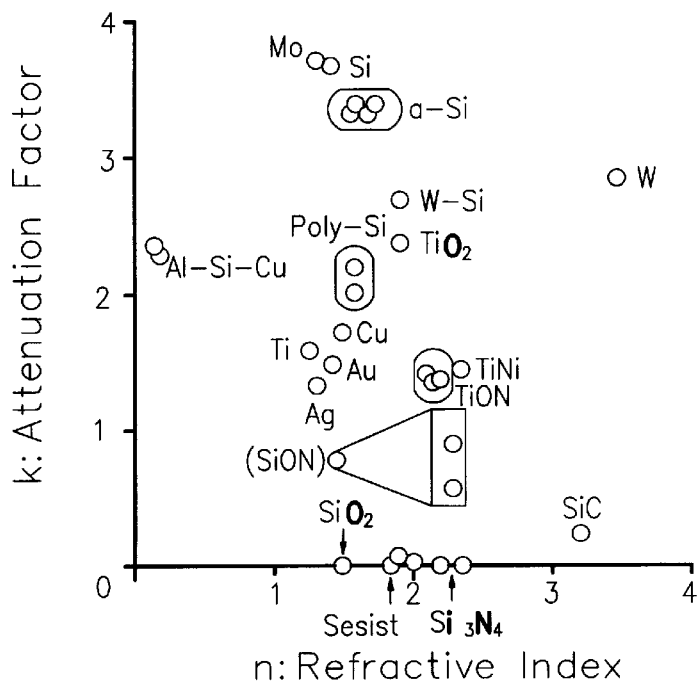
FIG. 5 is a table of data showing the values of the refractive indexes and attenuation factors of various optical materials.
FIG. 6 is a graph showing the refractive indexes and attenuation factors of various optical materials for an exposure light wavelength of 248 nm (deep ultraviolet)

FIG. 5 is a table of data showing the refractive indexes and attenuation factors of various optical materials (for exposure light wavelengths of 157 nm, 193 nm, and 248 nm, respectively) that can be used to form the shifter layer in the PSM of the invention. The 248 nm wavelength (i.e., the wavelength of deep ultraviolet) is particularly useful—as the exposure light. FIG. 6 is a graph showing the refractive indexes and attenuation factors of various optical materials for an exposure light wavelength of 248 nm. The materials shown in FIGS. 5 and 6 can be selected for use as the shifter layer in the PSM of the invention. In addition, some other materials, such as $MoSi_zO_xN_y$ and $SiO_xN_y$, can allow the refractive index and attenuation ratio to be varied simply by changing the atom ratio x:y:z or x:y. In this case, the blinding portion and phase shifting portion of the same shifter layer might not have to be different in thickness, but can still nonetheless provide the desired blinding and phase shifting effects.

FIGS. 7A–7D are schematic cross-sectional diagrams used to depict the steps involved in the method of the invention for fabricating a PSM with a single shifter layer that is formed with two different thicknesses to provide the desired blinding and phase shifting effects.

Figure 7A:
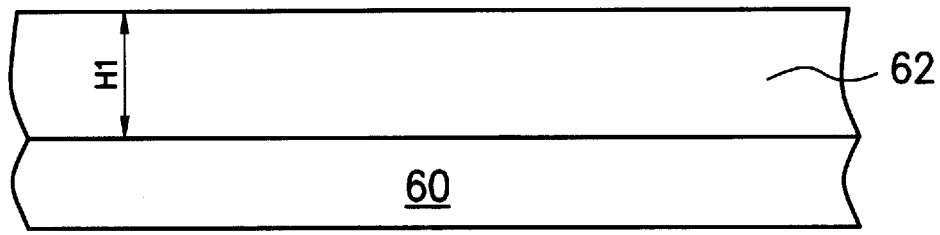
FIGS. 7A–7D are schematic cross-sectional diagrams used to depict the steps involved in the method of the invention for fabricating the PSM structure of the invention.

In the first step, shown in FIG. 7A, a quartz substrate 60 is prepared and a shifter layer 62 is subsequently formed over the quartz substrate 60 through, for example, a physical vapor deposition (PVD) process, to a specific thickness H1.

Figure 7B:
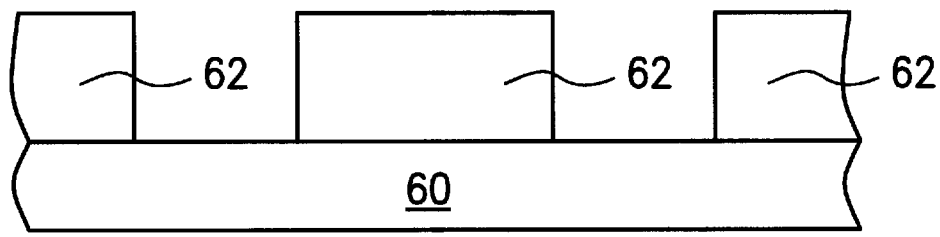

FIG. 7B shows the next step, in which the shifter layer 62 is selectively removed through, for example, a photolithographic and etching process. The remaining portions of the shifter layer 62 will serve as the blinding portions of the PSM, while the removed portions will served as the unmasked portions of the same.

Figure 7C:
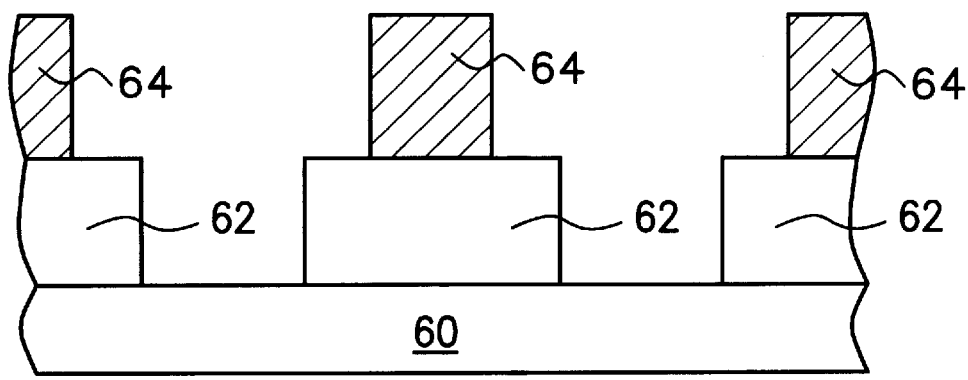

FIG. 7C shows the subsequent step, in which a photoresist layer 64 is coated over the entire top surface of the shifter layer 62. The photoresist layer 64 is then selectively removed in such a manner as to allow each shifter layer 62 to be covered by a photoresist layer 64 which is smaller in dimensions than the underlying shifter layer 62.

Figure 7D:
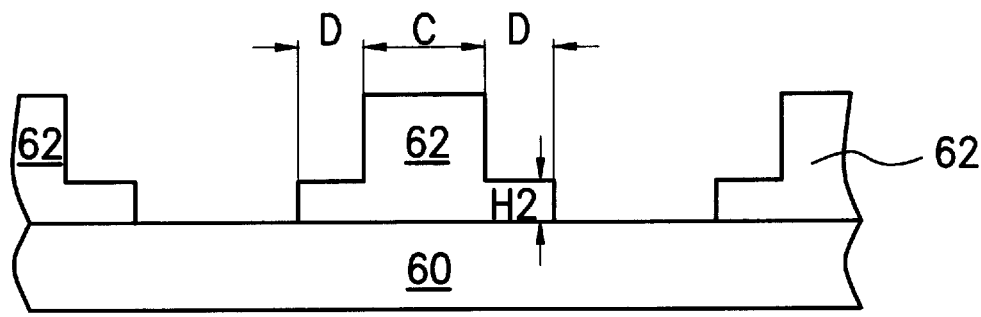

In the following step, shown in FIG. 7D, an etching process is performed through the photoresist layer 64 on the underlying shifter layer 62 so as to remove part of the exposed portions of the shifter layer 62 until the exposed portions of the shifter layer 62 is reduced to a specific thickness H2. After this, the entire photoresist layer 64 is removed. This completes the fabrication for the PSM of the invention. As shown in FIG. 7D, the thick portion of the shifter layer 62 (as designated by the reference numeral C) has a large thickness H1 serving as the blinding portion of the PSM, while the thin portion of the same (as designated by the reference numeral D) has a small thickness H2 which is specifically controlled to a predetermined value to serve as the phase-shifting portion of the PSM.

It can be learned from the foregoing description that the method of the invention for fabricating a PSM requires the use of one single kind of material and one single deposition step to form the shifter layer. Compared to the conventional method for fabricating the ring PSM, which requires two deposition steps and two selective etching steps to form respectively the blinding layer and the shifter layer, it is apparent that the invention has some advantages over the prior art. Compared to the conventional method for fabricating the alternating PSM, which also requires two deposition steps and two selective etching steps to form respectively the blinding layer and the shifter layer, and in addition requires two sets of depositions machines and two different vapor compositions for the deposition, it is apparent that the invention is considerably simplified in its procedural steps. The invention requires one single kind of material, one single deposition step, one single set of deposition machine, and one single kind of vapor composition to fabricate the PSM. The invention therefore has many advantages over the prior art.

The invention is also applicable on a multiple PSM with a number of phase-shifters for the purpose of reducing the so-called side-lobe effect. For example, a multiple PSM may be formed with a first shifter layer having a transmittance of from 4% to 8% and able to cause a phase shift of 180° and a second shifter layer having a transmittance of from 4% to 8% and able to cause a phase shift of 0°. In accordance with the invention, the single shifter layer can be formed with three thicknesses through three selective removal steps. Compared to the conventional method for fabricating the multiple PSM, the method of the invention is undoubtedly more advantageous.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A PSM structure comprising:

a quartz substrate; and a shifter layer formed over said quartz substrate, said shifter layer being formed with a first thickness of specific value to serve as the blinding portion of the PSM and a second thickness of specific value to serve as the phase-shifting portion of the PSM.

2. The PSM structure of claim 1, wherein said first thickness is larger than said second thickness to serve as the blinding portion of the PSM.

3. The PSM structure of claim 1, wherein said second thickness is smaller than said first thickness to serve as the phase-shifting portion of the PSM.

4. The PSM structure of claim 1, wherein said first thickness allows the associated portion of said shifter layer to have a first transmittance and to be able to cause a first phase shift to the light passing therethrough, while said second thickness allows the associated portion of said shifter layer to have a second transmittance and to be able to cause a second phase shift to the light passing therethrough.

5. A method of fabricating a PSM, comprising:

(1) preparing a quartz substrate;

(2) forming a shifter layer over said quartz substrate to a first thickness of specific value that allows the shifter layer to have a first transmittance and to be able to cause a first phase shift to the light passing therethrough;

(3) removing selected portions of the shifter layer that are to be used as the unmasked portions of the PSM and defining a first part of the remaining portions of the shifter layer as the blinding portions of the PSM and a second part of the same as the phase-shifting portions of the PSM; and (4) reducing the phase-shifting portions of the PSM to a second thickness of specific value that allows the phase-shifting portions to have a second transmittance and be able to cause a second phase shift to the light passing therethrough.

6. The method of claim 5, wherein the first thickness is larger than the second thickness, which allows the first transmittance to be less than the second transmittance.

7. The method of claim 5, wherein said first thickness is larger than said second thickness to serve as the blinding portion of the PSM.

8. The method of claim 5, wherein said second thickness is smaller than said first thickness to serve as the phase-shifting portion of the PSM.

9. The method of claim 5, further comprising:

reducing selected part of the phase-shifting portions of the shifter layer to a third thickness less than the second thickness, allowing the remaining portions to have a third transmittance and be able to cause a third phase shift to the light passing therethrough.

10. The method of claim 5, wherein said step (3) includes the substeps of:

forming a photoresist layer over the shifter layer;

removing selected portions of the photoresist layer so as to expose those portions of the shifter layer that are to be removed; and performing an etching process through the photoresist layer on the shifter layer until those portions not covered by the photoresist layer are reduced to a second thickness, less than the first thickness, that defines the second transmittance and the second phase shift.

11. A method for using a PSM comprising the acts of:

providing a semiconductor substrate having a layer of a photoresist material disposed thereon; and exposing said photoresist material to an exposure light passing through said PSM, said PSM comprising, a quartz substrate, and a shifter layer formed over said quartz substrate, each shifter layer being formed with a first thickness of a specific value to serve as a blinding portion of said PSM and a second thickness of a specific value to serve as a phase-shifting portion of said PSM.

12. The method of claim 11 further including the act of developing said photoresist material following the act of exposing said photoresist material to an exposure light passing through said PSM.

13. The method of claim 11 wherein the said first thickness is larger than said second thickness to serve as said blinding portion of said PSM.

14. The method of claim 11 wherein the said second thickness is smaller than said first thickness to serve as said phase-shifting portion of said PSM.

* * * * *